United States Patent [19]

Boggs et al.

[11] 4,164,703
[45] Aug. 14, 1979

[54] METHODS OF AND APPARATUS FOR DETECTING OPENINGS IN CABLE JACKETS

[75] Inventors: Luther M. Boggs, Dunwoody; James A. Hudson, Jr., Atlanta, both of Ga.

[73] Assignee: Western Electric Company, Inc., New York, N.Y.

[21] Appl. No.: 862,252

[22] Filed: Dec. 19, 1977

[51] Int. Cl.² .................... G01R 31/14; G01R 31/02
[52] U.S. Cl. .................................................. 324/54
[58] Field of Search ................... 324/52, 54, 61 R, 62, 324/65 R

[56] References Cited

U.S. PATENT DOCUMENTS

| | | | |
|---|---|---|---|
| 3,096,478 | 7/1963 | Brown | 324/54 |
| 3,241,061 | 3/1966 | Quittner | 324/61 R |
| 3,277,365 | 10/1966 | Doran | 324/54 |
| 3,781,666 | 12/1973 | Dornberger | 324/54 |

FOREIGN PATENT DOCUMENTS

| | | | |
|---|---|---|---|
| 545916 | 9/1957 | Canada | 324/54 |
| 760040 | 10/1953 | Fed. Rep. of Germany | 324/54 |
| 2219136 | 10/1973 | Fed. Rep. of Germany | 324/54 |
| 881415 | 11/1961 | United Kingdom | 324/54 |
| 1234942 | 6/1971 | United Kingdom | 324/54 |
| 1317154 | 5/1973 | United Kingdom | 324/54 |

*Primary Examiner*—Gerard R. Strecker
*Attorney, Agent, or Firm*—E. W. Somers

[57] ABSTRACT

An opening in a jacket (15) of a cable (16) is detected as the jacketed cable is moved from an extruder (14) through a probe (21) which is positioned in a cooling trough (17) and which comprises first and second aligned, spaced sensors (24, 26) with each of the sensors being connected to an arm of a bridge transformer (37). Electrical circuitry is designed to cause an unbalance voltage in a secondary (43) of the transformer (37) in response to conductance unbalance as the opening in the jacket (15) is advanced through the first sensor (24) and to cause an unbalance voltage of opposite polarity in the secondary (43) in response to conductance unbalance as the opening in the jacket (15) is advanced through the second sensor (26). Logic circuitry (66) tests the unbalance voltages for threshold and peak values to discern jacket holes despite the presence of extraneous signals such as those which are caused by noise.

12 Claims, 7 Drawing Figures

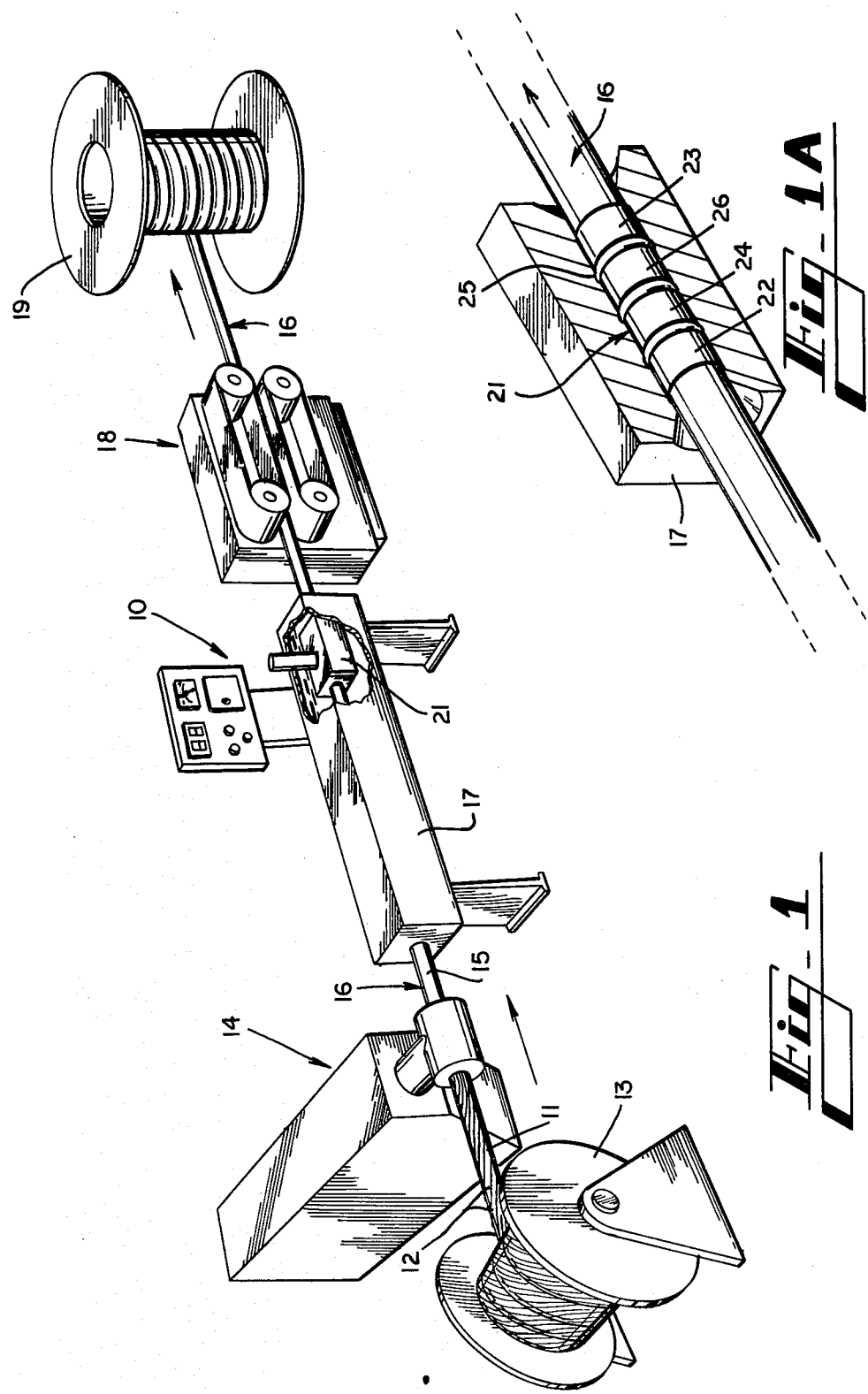

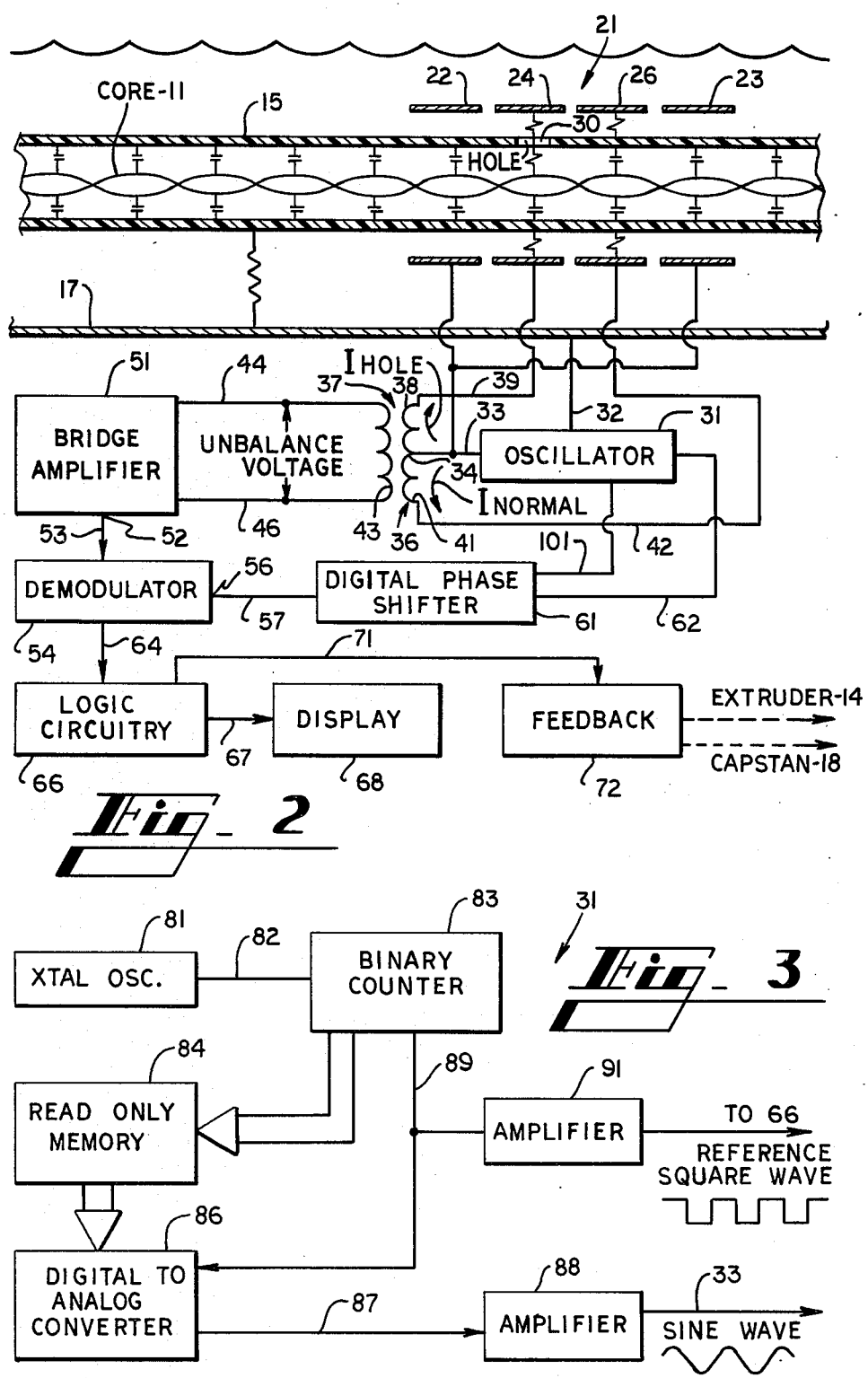

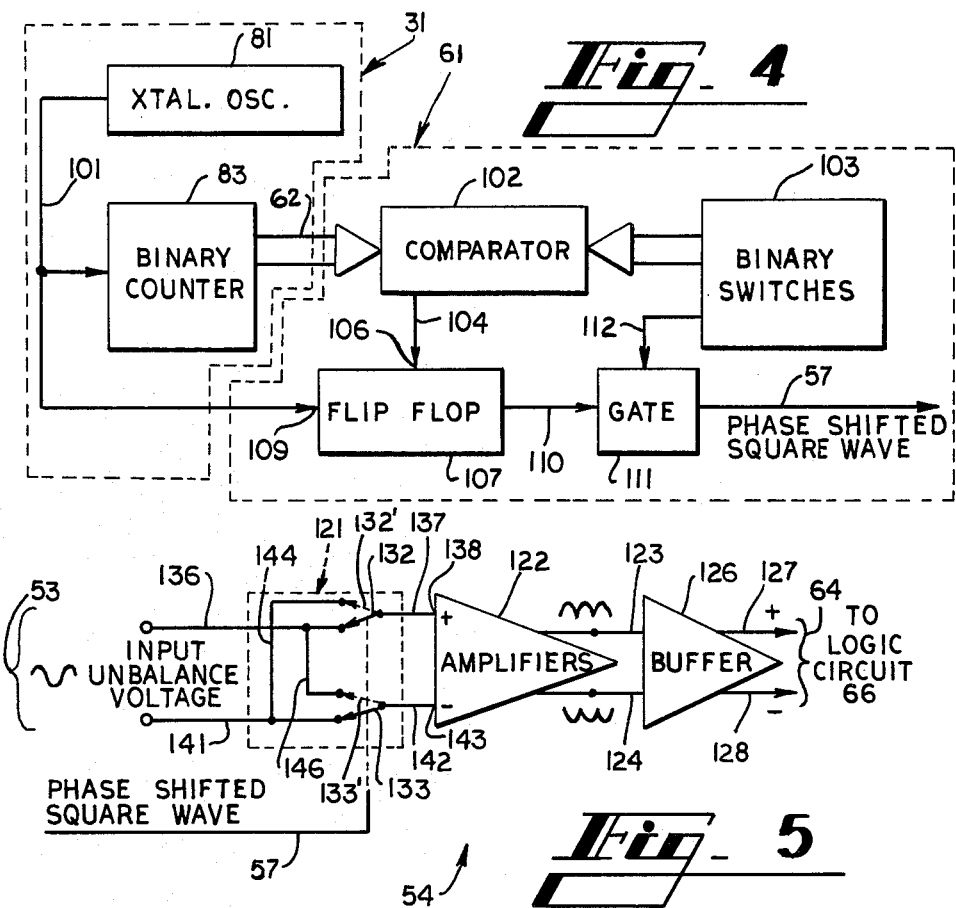
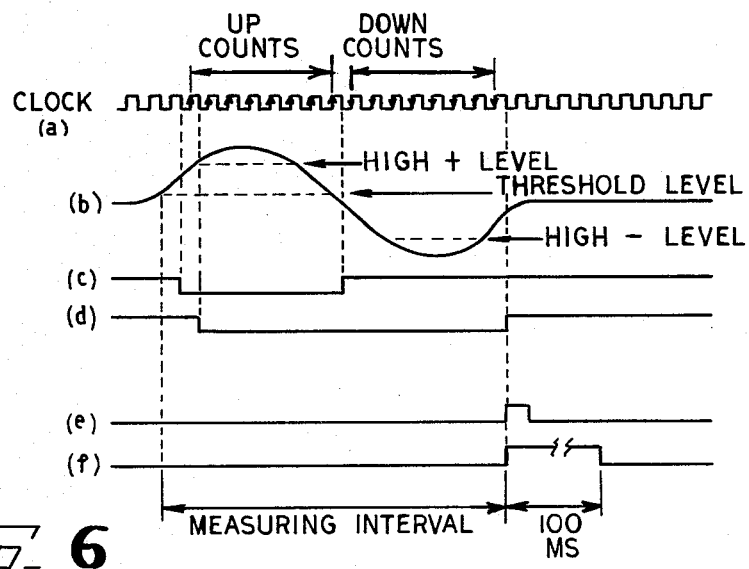

METHODS OF AND APPARATUS FOR DETECTING OPENINGS IN CABLE JACKETS

TECHNICAL FIELD

This invention relates to methods of and apparatus for detecting openings in cable jackets, and, more particularly, to methods of and apparatus for detecting openings in a thin-wall cable jacket made of a plastic material by a test for conductance unbalance as the cable is advanced along a manufacturing line.

BACKGROUND ART

One kind of defect that can occur during the manufacture of cables is an opening in a plastic jacket which encloses a core that comprises a plurality of individually insulated conductors. Unwanted jacket openings may be caused in several ways during the manufacture of a cable, such as, for example, by line and drive system disturbances. An incomplete breakup of plastic pellets, which are supplied to a jacketing extruder, or a loose binder wrapped about the core can cause a protuberance such that a plastic melt comprising an extrudate tears about the protuberance as it is pulled down into engagement with the core.

Such openings are more likely to occur in thin-wall jackets, i.e. on the order of 20 to 40 mils thick, which are customary for inside wiring and switchboard cables, than in those cables used in other environments where jacket thicknesses are generally on the order of 45 to 100 mils. This problem has become more critical in recent years because of plastic material shortages. With petroleum-based plastics not infrequently in short supply, there has been a trend toward the use of thinner jackets of perhaps different plastics which offer the same amount of mechanical and electrical protection notwithstanding the thinner wall.

Until recently, there had been no industry wide effort in telecommunications cable manufacture to detect jacket openings along a manufacturing line on which a cable core is jacketed. This may be due, at least in part, to the heretofore uninterrupted supply of plastic and hence the absence of a need to minimize jacket thicknesses.

Commercially available equipment which generally is designed to detect coaxial capacitance unbalance caused by jacket openings does not consistently and reliably differentiate between jacket openings and noise. Coaxial capacitance as measured from a probe to the cable core varies because the jacket is not always concentrically disposed about the core with the jacket thickness varying within acceptable limits. Inasmuch as capacitance is an area-sensitive electrical characteristic, a further drawback to the use of capacitance unbalance to detect jacket openings is that an opening of significant size must occur to cause a measurement reading to vary beyond its normal range.

The prior art includes U.S. Pat. No. 3,047,799 which discloses interference-free spaced dual probes for detecting deleterious occlusions within insulated conductors. The methods used in this patent require (1) that the conductor under test be grounded, (2) that a high voltage be applied as the conductor is passed through the dual probe to cause corona at the insulation occlusion, (3) that distilled water be used as a couplant in order to obtain a high resistance between an exciting ring and the insulated conductor under test, and (4) that a center conductor be excited and that signals radiated from the occlusions be detected.

Also included in the prior art is a bare wire detecting device which includes two conductive zones that are insulated and spaced from each other by a predetermined distance. A relatively high D.C. voltage is impressed across the two zones to cause bare portions of an insulated conductor which are equal to or longer than the distance between the zones to complete a circuit to indicate the presence of unacceptable lengths of bare wire. See U.S. Pat. No. 3,277,365. This device is inapplicable to a test for jacket openings since there is no bare wire; moreover, this arrangement, which relies on high voltage for its test, is not desirable for use in a factory environment.

It is also old to use light to detect the presence of pinholes during the manufacture of a metallic strip such as tinplate which may be moved at speeds up to approximately 1524 meters per minute. The use of a light source and a conventional detector tube on opposite sides of a jacketed cable core would not be adaptable to the detection of jacket openings for obvious reasons.

Nowhere in the prior art does there appear to be a simple, on-line apparatus which may be used to detect jacket openings without the necessity of special couplants such as distilled water in cooling troughs, without the necessity of relying on an operator for externally grounding the cable, and without the need to externally excite the cable under test.

DISCLOSURE OF THE INVENTION

The foregoing problems are overcome by this invention for testing an advancing cable which includes a multi-conductor core enclosed in a plastic jacket to detect the presence of openings in the cable jacket. In accordance with the invention, a method of detecting openings in a cable includes the steps of sensing conductance across a plastic jacket of each of a first pair of adjacent sections of a cable which includes a multiconductor core that is enclosed in the plastic jacket, sensing conductance across the plastic jacket of each of a second pair of adjacent sections of the cable in which one of the adjacent sections of the second pair is common to the first pair, detecting conductance unbalance, if any, that exists between the first and second pairs of cable sections, and measuring the magnitude of the conductance unbalance to determine the occurrence of openings in the cable jacket.

An apparatus in accordance with this invention includes facilities for advancing a cable which includes a multi-conductor core that is enclosed in a plastic jacket along a path through spaced first and second sensors, facilities for continuously sensing conductive current across each adjacent section of cable within the first and second sensors, facilities for continuously detecting conductive current unbalance, if any, between the adjacent sections of cable within the first and second sensors such that each new section which is advanced into the first sensor is compared to the section present in the second sensor, and facilities for measuring the conductive current unbalance to determine the occurrence of openings in the cable jacket.

BRIEF DESCRIPTION OF THE DRAWINGS

Other features of the present invention will be more readily understood from the following detailed description of specific embodiments thereof when read in conjunction with the accompanying drawings, in which:

FIG. 1 is a perspective view of an apparatus in accordance with this invention for detecting openings in a cable jacket in which a cable extends through a probe which is positioned in a water trough;

FIG. 1A is an enlarged view of a portion of the water trough in FIG. 1 with the probe positioned therein;

FIG. 2 is a schematic view in elevation of a portion of the water trough with the probe positioned therein and connected to an electrical circuit for detecting the openings;

FIG. 3 illustrates in schematic form oscillator circuitry utilized in practicing the invention;

FIG. 4 is a schematic view of digital phase shifter circuitry;

FIG. 5 is a schematic view of demodulator and output buffer circuitry; and

FIG. 6 is a timing diagram which illustrates wave forms which are present at various points in the circuitry of the apparatus.

DETAILED DESCRIPTION

An apparatus, designated generally by the numeral 10, (see FIG. 1), in accordance with this invention for detecting openings in cable jackets, particularly those made of polyvinyl chloride (PVC), operates on the principle of conductance unbalance as opposed to capacitance unbalance. Since capacitance is an area-sensitive measurement, a significant area of a capacitor or effective capacitor must be influenced in order to unbalance a capacitance measurement to the point of being measurable. On the other hand, conductance is affected greatly by changes in resistance so that an opening in a plastic insulating material will significantly influence that parameter and readily facilitate the determination of unbalance.

Advantageously, the apparatus 10 is designed to be used on a manufacturing line where a cable core 11 which comprises a plurality of individually insulated conductors 12—12 is to be jacketed. The core 11 is advanced along a path from a payoff reel 13 through an extruder 14 where the core is covered with a jacket 15 of a plastic material such as, for example, polyvinyl chloride (PVC) to form a cable 16. Then the jacketed cable 16 is advanced through a cooling trough 17 and through the apparatus 10 which is immersed in the cooling trough. Subsequently, the jacketed core 11 is advanced out of the trough 17 at a line speed of about 366 meters/minute by a capstan 18 and taken up on a reel 19.

Referring now to FIGS. 1A and 2, it can be seen that the apparatus 10 includes a probe 21 which is positioned in the cooling trough near the exit end thereof. The probe 21 comprises two cylindrical spaced guard sections 22 and 23 with a first cylindrical sensor 24 and an adjacent second cylindrical sensor 26 being positioned between the two guard sections. In a preferred embodiment, each of the guard sections 22-23 and each of the sensors 24 and 26 is about 2.5 cm along and is made of commercially available brass. The guard sections 22 and 23 and the sensors 24 and 26, which are disposed concentrically about the path along which the jacketed cable 16 is advanced, are spaced apart about 0.16 cm by flat sealing rings 25—25 which are made of a material such as neoprene. The sealing rings 25—25 prevent a shorting out between adjacent sections of the probe and also perform a hermetic function.

As can be seen in FIG. 2, the sensors 24 and 26 are resistively coupled through the water in the trough 17 to the cable jacket 15 from which a current is capacitively coupled to the multi-conductor core 11. After the current is capacitively coupled to the core 11, the current observes a low impedance in each direction along the cable 16 because of the relatively long length of the trough 17 compared to the length of each of the sensors 24 and 26, i.e. 457 cm compared to about 2.5 cm. Outside of the probe 21, electrical currents which have been capacitively coupled to the core 11 are returned along a resistive path to the trough 17 through the water which functions to short out the current from the jacket 15 to the trough. The probe 21 is designed to test sections of the cable 16 for openings or holes 30—30 along a predetermined length of its path through the trough 17 with minimum interference from the cooling water.

As can best be seen in FIG. 2, an oscillator, designated generally by the numeral 31, is connected along a lead 32 to the cooling trough 17. The oscillator 31 is also connected along a lead 33 into a center tap 34 of a primary winding 36 of a bridge transformer 37. The bridge transformer 37 has a low impedance primary winding 36 at a frequency of 10 KHz so that the impedance of the water and the capacitive coupling to the core 11 govern the flow of current in the primary winding. One end of one coil 38 of the transformer primary 36 is connected along a lead 39 to the upstream sensor 24 of the probe 21 while the other oppositely wound coil 41 is connected along a lead 42 to the downstream sensor 26. As can be seen by the schematic of FIG. 2, an outer surface of the cable jacket 15 is effectively connected by ordinary tap water to the adjacent sensors 24 and 26 of the probe 21 which are in turn connected to the bridge transformer 37. Under balanced conditions, i.e. no holes in the jacket 15, each of the sensor sections 24 and 26 will draw equal current so that the net voltage across the primary winding 36 is zero with no voltage being induced in a secondary winding 43 of the bridge transformer 37.

The secondary winding 43 of the bridge transformer 37 is connected along two leads 44 and 46 to a commercially available bridge amplifier 51 such as one which may be purchased, for example, from Princeton Applied Research Company and identified as Model No. 113. The voltage on the input and on the output side of the bridge amplifier 51 during those times when openings in the jacket 15 are being moved through the sensors 24 and 26 is a 10 KHz sine wave.

An output 52 of the bridge amplifier 51 is connected along a lead 53 to demodulator and output buffer circuitry, designated generally by the numeral 54. The demodulator and output buffer circuitry 54 also has an input 56 which is connected along a lead 57 to digital phase shift circuitry, designated generally by the numeral 61, which receives an input along a lead 62 from the oscillator 31. The demodulator and buffer circuitry 54 inverts alternate half cycles of a sine wave input from the bridge amplifier 51 and provides the resulting wave form which is shown in FIG. 6(b) and is referred to hereinafter as the "hole signal".

An output of the demodulator and buffer circuitry 54 is connected along a lead 64 to an input of logic circuitry, designated generally by the numeral 66. The output signal of the logic circuitry 66 may be fed along a lead 67 to a display device 68 which signifies to an operator both the presence and location of openings in the jacket 15. Signals from the logic circuitry 66 may also be fed along a line 71 to a feedback control apparatus, designated generally by the numeral 72, which controls the operation of line equipment such as the extruder 14 or the capstan 18 to avoid the occurrence of openings in the cable jacket 15.

When a portion of the jacket 15 which includes a hole 30 is advanced through the sensor 24, the current in that sensor increases while that in the sensor 26 remains unchanged, thereby causing a net voltage across the primary winding 36 of the transformer. As the portion of the cable 20 which includes the jacket hole 30 is advanced to a point intermediate the sensors 24 and 26 of the probe 21, equal currents will flow and there is no voltage unbalance across the primary winding 36 of the bridge transformer 37. Then when the portion of the jacket 15 having the hole 30 is advanced into the sensor 26, the voltage across the primary winding 36 again becomes unbalanced, but shifted 180° from the unbalance when the hole was in the sensor 24.

Thus by using a phase sensitive rectifier, to transform a voltage which is produced in the transformer winding 43, and amplified, a signal is produced that increases positively as the hole 30 moves to the center of the sensor 24, then decreases to zero as the hole passes between the two sensors 24 and 26, and decreases to a negative peak when the opening reaches the center of the sensor 26. The apparatus 10 is capable of reliably detecting holes 30—30 which are smaller than 0.16 cm in diameter at line speeds in excess of 366 meters per minute.

The change in polarity of the unbalance voltage as the hole 30 progresses through the sensors 24 and 26, as well as the values of their amplitudes, characterizes the output of the demodulator and output buffer circuitry 54 which is fed to the logic circuitry 66. Provided that the just-described pattern exists, the logic circuitry 66 has the capability of determining whether or not a hole 30 exists.

While the guard sections 22 and 23 are not required, they are preferred in order to cause any current flow through the jacket 15 to occur between the guard sections and radially inwardly of the core 11 instead of being dispersed, thereby avoiding "fringing". The guard sections 22 and 23 are effective to electrically cut off the cable 16 and isolate portions of the cable in the sensors 24 and 26 so that each sensor is effectively testing a short length or section of the cable jacket 15.

The components which are included in the circuitry 31, 51, 54 and 61 represent an arrangement for achieving a high degree of accuracy in the process for monitoring the presence of openings in the cable jacket 15. It is to be understood, however, that other circuit arrangements for maintaining the integrity of the cable jacket 15 might also be used in conjunction with the principle of detecting cable jacket openings 30—30 by detecting changes in conductance. The following description is directed to the circuitry of the blocks 31, 51, 54 and 61; however the logic circuitry 66 will not be described in detail since its construction should be apparent to one skilled in the art.

The oscillator circuitry 31 (see FIG. 3) includes a 2.56 MHz crystal oscillator 81 which is connected along a lead 82 to a scaler counter circuit 81. A read-only-memory (ROM) device 84 is addressed by the counter 83 to "look-up" binary numbers which are stored in memory addresses numbered from 1 to 256 and which each correspond to a voltage along a sine wave. For example, at address or location number 128, there is stored a binary number which corresponds to the peak value of the positive excursion of a sine wave. The binary number output from the read-only-memory device 84 is applied as an input to a digital-to-analog converter 86 which synthesizes a 10 KHz sine wave having a half period of 50 μs. The sine wave output from the digital-to-analog converter 86 is applied via a lead 87 to a high frequency, smoothing amplifier 88 and then along the lead 33 to the transformer 37. The counter 83 also provides an input over a lead 89 to an amplifier 91 which through the digital-to-analog converter 86 produces a reference square wave which is in synchronization with the 10 KHz sine wave. The reference square wave also appears as the waveform shown in FIG. 6(a) and is used as a clock input to the logic circuitry 66.

The digital phase shift circuitry 61 synthesizes a 10 KHz square wave which is in phase with the 10 KHz sine wave that is received from the bridge amplifier 51 in order to operate the demodulator circuitry 54. The reference square wave which is fed out of the amplifier 91 of the oscillator circuitry 31 is used as a clock pulse in the logic circuitry 66 whereas the phase-shifted, square wave which is provided by the digital phase shift circuitry 61 is in synchronization and in phase with the unbalance voltage.

Referring now to FIG. 4, it can be seen that inputs to the digital phase shift circuitry 61 are fed along lines 101 and 66 from the 2.56 MHz oscillator 81 and the counter 83, respectively, of the oscillator circuitry 31. The counter 83 is capable of counting up to 256 and is designed to generate a binary number every cycle, i.e. every 400 nanoseconds which is fed from the binary counter 83 into a comparator 102. The digital phase shift circuitry 61 also includes an adjustable binary switch or binary pattern bit generator 103 which includes eight binary switches that can be set to any one of 256 patterns. The switch 103 is designed to shift the square wave relative to the 10 KHz sine wave which is provided by the bridge amplifier 51 in order to operate the demodulator circuitry 54.

The binary pattern bit generator 103 is preset so that seven of the eight switches enter a seven bit binary number for shifting the phase of the square wave through almost 180 degrees. Since seven switch bits correspond to 128 discrete steps of phase shift, a resolution of 1.4 degrees per step is achieved. Experiments have shown that this phase shift technique is well suited for precisely phase matching the square wave and the 10 KHz sine wave which are fed into the demodulator circuitry 54; however, for other applications, a different resolution may be required and may be determined empirically.

The binary number which is generated by the preset switch 103 is sufficient to produce a square wave, which is shifted with respect to the reference square wave, such that each of its crossovers is aligned with the crossovers of the sine wave signal which is received from the transformer 37. The binary number which is generated by the binary switch 103 is applied as an input to the comparator 102. When that number compares equal to that received from the counter 83, a transition point on the phase shifted square wave is determined. This transition point is shifted in time from the zero crossing of the 10 KHz sine wave of the oscillator output along the lead 33 by the number of 2.56 MHz clock cycles which are set through the binary switch 103.

When the outputs from the counter 83 and from the switch 103 are compared equal by the comparator 102, it generates a signal at that particular clock pulse which is applied over a lead 104 to an input 106 of a flip-flop 107. Also, the oscillator 81 applies a 2.56 MHz clock signal over a line 108 to an input 109 of the flip-flop 107. When signals are present on both of the inputs 106 and 109 of the flip-flop 107, it is set and in turn activates a gate 111 which also receives an input from the switch 103 over a lead 112. The input to the gate 111 over the lead 112 is provided by the most significant of the switches in the switching device 103. In a preferred embodiment, the gate 111 is an exclusive "OR" gate which produces an output signal when a high or "1" signal is present on either of its inputs. This causes the output of the gate 111, which is a phase-shifted square wave with its transition points corresponding to the transition points of the sine wave from the bridge amplifier 51 because of the adjustment in the binary switch 103, to be inverted for operational convenience.

The phase-shifted square wave is applied over the lead 57 to a switching device 121 (see FIG. 5) of the demodulator and output buffer circuitry 54 which operates between input positive and input negative positions in synchronization with the signal which is received along the lead 53 from the bridge amplifier 51. The demodulator and output buffer circuitry 54 functions as a switching type detector that operates on the amplified bridge unbalance voltage to produce a D.C. output envelope which is proportional to the conductance unbalance in the probe 21. The demodulator and buffer circuitry 54 provides for both positive and negative phase sensitive signal detection, which are identical signals except that they are 180 degrees out of phase. Differential amplifiers 122—122, which are well known in the art and available commercially, produce outputs that are then fed along leads 123 and 124 through a buffer amplifier 126 which averages the positive and negative fully rectified outputs from the amplifiers to provide differential outputs of conductance deviation along leads 127 and 128 and to the logic circuitry 66.

As can be seen in FIG. 5, the switching device 121 reverses the polarity of the bridge unbalance voltage which is fed into the amplifiers 122—122 at each zero crossing of the sine wave under control of the phase-shifted square wave. In order to provide for both positive and negative phase sensitive detection, the switching device 121 of the demodulator circuitry 54 includes a pair of solid state switches which are represented as mechanical switches 132 and 133 in FIG. 5 for simplicity.

The phase-shifted square wave is effective to cause the switches 132 and 133 to operate at each zero crossing of the signal which is received from the bridge transformer 37. A positive input to a lead 136 is applied over the switch 132 along a lead 137 and applied as a positive input 138 at the amplifier 122—122. A negative input on a lead 141 is fed through the other switch 133 shown in the unbroken position in FIG. 5 and along a lead 142 and applied as an input to the negative terminal 143 of the amplifiers 122—122. Since the transition points of the square wave which is fed into the switching device 121 correspond to the transition points of the sine wave which is received from the bridge transformer 37, the next excursion of the shifted square wave causes the switching device 121 to be controlled to move the switches 132 and 133 to input negative positions as shown by the broken line positions in FIG. 5 and designated 132' and 133'. At that time, a positive input along the lead 141 is routed along a lead 144 through switch 132' and the lead 137 to the positive input 138 of the amplifier 122—122 whereas a negative input along the line 136 is applied along a lead 146 through the switch 133' and the lead 142 to the terminal 143. As a result, phase-sensitive detection occurs with the resultant wave forms being shown on the output side of the amplifiers 122—122 in FIG. 5.

The outputs from the amplifiers 122—122 are fed along leads 123 and 124 to the buffer amplifier 126 which increases the amplitude of the signals while lowering their impedance. The signals which are fed from the demodulator circuitry 54 along a lead 64 to the logic circuitry 66 must be driven with a low impedance because of the high capacitance present in lengthy leads that extend from the demodulator circuitry, which is generally at the probe 21, back to a central instrument panel. The buffer amplifier 126 is effective to avoid a filtering out of the signal which could result in a loss of signal at the monitoring station. In a preferred embodiment, the logic circuitry 66 is located at the probe 21 thereby obviating the need for the buffer amplifier 126. This follows preferred design practice of monitoring as close as possible to point of signal pick-up to avoid the effects of extraneous signals.

The logic circuit 66 is constructed with hole counting logic which is effective to test signals which are received from the demodulator circuitry 54 to verify that certain characteristics do or do not occur. Operation of the hole counting logic is best understood by referring to FIG. 6. Referring now to FIG. 6(a), there is shown a clock pulse with up counts and down counts and in FIG. 6(b) a hole signal, which is representative of a hole in the cable jacket 15. As can be seen in that figure, a jacket hole 30 causes an almost symmetrical signal to be generated because the cable 16 is advanced through each of the sensors 24 and 26 at the same speed. On the other hand, a noise signal is usually of single polarity and assymetric.

There is no unbalance in the bridge transformer of the electrical circuit when sections of the cable 16 having no openings in the jacket 15 are advanced through the probe 21. Since the current is the same in each of the oppositely wound coils 38 and 41 of the primary 36 of the bridge transformer 37, there is no unbalance in the secondary winding 43. Also, there is no unbalance, if a hole is present simultaneously in each section of the cable jacket 15 within the sensors 24 and 26; however, it has been found that the probability of such an occurrence is essentially zero.

An up/down count is used to determine the measuring intervals in which both positive and negative peaks must exceed the preset thresholds in order to be a valid signal which represents a hole in the jacket 16 FIGS. 6(c) and (d) illustrate the up count interval and the total counting intervals, respectively. It is important to recognize that the frequency of the hole-generated signals at line speeds up to about 460 meters/minute is relatively low compared to the frequency of the oscillator 81. At a line speed of about 15 meters/minute for example, the hole signal may have a half period of 100 milliseconds whereas if the line speed is increased to 152 meters/minute, the half period decreases to 10 milliseconds. This causes the logic circuitry 66 to be able to perform its tests on each half of the sine wave which represents the conductor current unbalance caused by a hole 30 notwithstanding changes in line speed. The measuring interval self-adjusts for different manufacturing line speeds in that the up-clock pulses are counted during the positive excursion of the hole signal. Then the count is decremented until zero is reached which in time occurs near the end of the hole signal and which occurs independent of line speed in a range of 38 to 457 meters/minute. Once the threshold is exceeded in the first half of the hole signal, the logic circuitry 66 is designed to look for a peak value within the same time period on the negative half wave. The 10 KHz output of the oscillator gives 40 cycles of the sine wave during the four milliseconds that a portion of the cable is within each 2.5 cm sensor section which permits ample opportunity for the demodulator circuitry 54 to develope an envelope.

A hole in the jacket 15 is detected by establishing the hole logic with respect to characteristics of its signal in a particular type of cable jacket 15. First, a positive excursion must exceed an initial threshold value of 0.5 volt. As soon as this occurs, the clock or the 2.56 KHz oscillator counts up as indicated with the small upwardly directed arrows in FIG. 6(a). The measurement of the threshold value is accomplished with a comparator which is a well known device in the art. Another comparator is used to determine if the signal exceeds a +3 volt value. Then as the signal drops below the +0.5 volt value, the clock begins to count down while still another comparator tests the signal to determine if it exceeds a negative excursion level of −3.0 volts before a counter (not shown) in the logic circuitry 66 reaches zero.

The determination that openings 30—30 are occurring in the cable jacket 15 is used to control the manufacturing line to eliminate subsequent occurrences of openings. If these characteristics of a hole signal are satisfied by the signal output of the demodulator circuitry 54, and the wave form shown in FIG. 6(b) is determined to represent the occurrence of an opening 30 in the jacket 15, then a hole indicating pulse (see FIG. 6(e)) is generated and fed over the line 71 (see FIG. 2) to the feedback control apparatus 72. The feedback control apparatus 72, through appropriate circuitry which is well known in the art and in response to hole count pulses generated by the logic circuitry 66, controls the extruder 14 to increase the thickness of the jacket 15. The feedback control apparatus 72 in response to hole count pulses being fed thereto may also generate signals to control the capstan 18 to reduce the line speed at which the cable 16 is advanced to effectively increase the thickness of the jacket 15. Obviously, the feedback control apparatus 72 may generate signals to control either one, or both, of the above-mentioned variables, as the jacket 15 is continuously monitored by the probe 21. Further, the logic circuitry 72 may generate a pulse as shown in FIG. 6(f) for operating a relay (not shown) which in turn drives a solenoid to cause a footage counter (not shown) to mark the location of the opening or a cable marking apparatus (not shown) to mark the cable 16 directly.

As an alternative to or as an addition to the feedback control apparatus 71, an analog display of the wave form shown in FIG. 6(b) may be provided such as, for example, on a strip chart. During the operation of the apparatus 10, the logic circuitry 66 may generate signals to cause the results of the continuous monitoring of the cable jacket 15 to be recorded on a recording device (not shown). The recording may be a continuous line interrupted with spikes at those points along the length of the cable 16 where the openings occur or there may be a digital print out which will signify to an operator that a jacket hole 30 has occurred. This is expensive since the line may run for hours without the occurrence of a hole; however, one advantage of a strip chart, i.e. the provision of a permanent record, is provided by using the logic circuitry 66 and the feedback device 71 in combination with a footage card device to record the footages at which holes occur.

It is to be understood that the above-described arrangements are simply illustrative of the invention. Other arrangements may be devised by those skilled in the art which will embody the principles of the invention and fall within the spirit and scope thereof.

What is claimed is:

1. A method of detecting openings in a cable jacket, which includes the steps of:
    sensing conductance across a plastic jacket of each of a first pair of adjacent sections of a cable which includes a core having a plurality of individually insulated electrical conductors, said core being enclosed in the plastic jacket;
    sensing conductance across the plastic jacket of each of a second pair of adjacent sections of the cable in which one of the adjacent sections of the second pair is common to the first pair;
    detecting any conductance unbalance that exists between the first and second pairs of cable sections; and
    measuring the magnitude of the conductance unbalance to determine the integrity of the cable jacket.

2. The method of claim 1, which also includes the step of advancing the cable through one and then another of two spaced sensors wherein the first pair of adjacent sections of the cable are those within the two spaced sensors and the second pair of adjacent sections of cable includes the section from the one sensor which is advanced into the other sensor and a next successive section of cable which is advanced into the one sensor.

3. A method of detecting openings in a cable jacket, which includes the steps of:
    advancing a cable, which includes a core having a plurailty of individually insulated electrical conductors, said core being enclosed in a plastic jacket, along a path through first and second sensors;
    continuously sensing conductive current across the plastic jacket of each adjacent section of cable within each of the first and second sensors;
    continuously detecting conductive current unbalance, if any, between the adjacent sections of cable within the first and second sensors with each new section that is advanced into the first sensor being compared to the section present in the second section; and
    measuring the conductive current unbalance to determine the occurrence of openings in the cable jacket.

4. The method of claim 3, wherein the step of measuring the conductive current unbalance includes the steps of determining whether the conductive current unbalance which is detected when an opening is present in the section of cable in the first sensor exceeds a threshold value, and then a peak value, and whether the conductive current unbalance when said section of the cable is advanced into the second sensor exceeds a predetermined peak value.

5. An apparatus for detecting openings in a cable jacket, which includes:
    first means for sensing conductance across a plastic jacket of each of a first pair of adjacent sections of a cable which includes a core having a plurality of individually insulated electrical conductors, said core being enclosed in the plastic jacket;

second means spaced from said first means along the length of said cable for sensing conductance across the plastic jacket of each of a second pair of adjacent sections of cable with one of the adjacent lengths of the second pair being common to the first pair;

means coupled to said first and second sensing means for detecting conductance unbalance, if any, which exists between the first and second pairs of cable sections; and means coupled to said unbalance detecting means for measuring the magnitude of the conductance unbalance to determine the integrity of the cable jacket.

6. The apparatus of claim 5, wherein the first and second means for sensing conductance across the first and second pairs of sections of cable include two spaced sensors, and the apparatus further includes means for advancing the cable through the sensors.

7. An apparatus for detecting openings in a cable jacket, which includes:
means for advancing a cable which includes a core having a plurality of individually insulated electrical conductors, said core being enclosed in a plastic jacket, along a path through spaced first and second sensors;
means coupled to said sensors for continuously sensing conductive current across each adjacent section of cable within each of the first and second sensors;
means coupled to said sensing means for continuously detecting conductive current unbalance, if any, between the adjacent sections of cable within the first and second sensors; and
means coupled to said detecting means for measuring the conductive current unbalance to determine the occurrence of openings in the cable jacket.

8. The apparatus of claim 7, wherein the means for measuring includes means for measuring whether the conductive current unbalance which is detected when a section of the cable having an opening in the jacket is in the first sensor exceeds the threshold value and then a peak value, and means for determining whether the conductive current unbalance in said section of cable which is then advanced into the second sensor exceeds a predetermined value.

9. A system for detecting openings in a cable jacket, which comprises:
a trough which contains a couplant;
first and second spaced sensor sections positioned in axial alignment with each other in the trough;
means for advancing a jacketed cable which includes a core having a plurality of individually insulated electrical conductors along the trough and through the sensor sections;
means responsive to an opening in the jacket being aligned with the first sensor section for generating a voltage wave form of one polarity and to the opening in the jacket being aligned with the second sensor section for generating a voltage wave form of the opposite polarity;
means rendered effective by the generation of successive voltage wave forms of opposite polarity and of predetermined amplitude characteristics for generating a pulse which indicates the presence of an opening in the jacket; and
means responsive to the generating of a pulse for utilizing the pulse to facilitate control of line parameters to prevent further openings in the jacket.

10. The system for detecting openings in a cable jacket as set forth in claim 9, wherein the means for generating a voltage wave form includes:
a bridge transformer having one end of a differentially wound, primary winding connected to the first sensor section and an opposite end of the primary winding connected to the second sensor section;
an oscillator connected to a center tap of the primary winding of the transformer and to the trough; and
means responsive to an opening in the jacket being aligned with the first sensor section and to a net coupling of voltage to a secondary winding of the transformer for generating a voltage wave form of one polarity and responsive to the opening in the jacket being aligned with the second sensor section and to a net coupling of voltage to the secondary winding for generating a voltage wave form of the opposite polarity.

11. The system of claim 10, wherein the oscillator is responsive to changes in resistance between the sensor sections and the cable core for causing a net coupling of voltage to the secondary of the transformer.

12. The system of claim 10, wherein the system also includes one guard section which is positioned adjacent of the first sensor section and another guard section which is positioned adjacent the second sensor section so that the cable is advanced through the one guard section, the first sensor section, the second sensor section and then the other guard section.

* * * * *